United States Patent
Kinoshita et al.

(10) Patent No.: US 6,631,726 B1
(45) Date of Patent: Oct. 14, 2003

(54) APPARATUS AND METHOD FOR PROCESSING A SUBSTRATE

(75) Inventors: Kazuto Kinoshita, Tukuba (JP); Kazuhiko Gommori, Ninomiya-machi (JP); Kenya Wada, Ninomiya-machi (JP)

(73) Assignee: Hitachi Electronics Engineering Co., Ltd., Tokyo (JP)

( * ) Notice: Subject to any disclaimer, the term of this patent is extended or adjusted under 35 U.S.C. 154(b) by 239 days.

(21) Appl. No.: 09/631,619

(22) Filed: Aug. 4, 2000

(30) Foreign Application Priority Data

Aug. 5, 1999 (JP) ............................. 11-221890
Jun. 2, 2000 (JP) ............................. 2000-165839

(51) Int. Cl.⁷ ................................................ B08B 7/04
(52) U.S. Cl. ..................... 134/102.1; 134/1; 134/1.3; 134/902; 250/455.11
(58) Field of Search ............... 134/902, 131, 134/124, 102.1, 102.2; 156/345.5, 345.51, 345.52, 345.54; 34/275, 72; 250/455.11, 492.1, 492.2, 453.11, 454.11

(56) References Cited

U.S. PATENT DOCUMENTS

| | | | | |
|---|---|---|---|---|
| 5,669,979 A | * | 9/1997 | Elliott et al. | 134/1 |
| 5,709,754 A | * | 1/1998 | Morinville et al. | 134/1.3 |
| 5,821,175 A | * | 10/1998 | Engelsberg | 438/795 |
| 6,178,973 B1 | * | 1/2001 | Franca et al. | 134/1.3 |
| 6,507,031 B1 | * | 1/2003 | Jinbo et al. | 250/455.11 |

FOREIGN PATENT DOCUMENTS

| | | | | |
|---|---|---|---|---|
| EP | 553967 A1 | * | 8/1993 | B08B/7/00 |
| JP | 04079325 A | * | 3/1992 | H05K/1/05 |

* cited by examiner

Primary Examiner—Alexander Markoff
(74) Attorney, Agent, or Firm—Oblon, Spivak, McClelland, Maier & Neustadt, P.C.

(57) ABSTRACT

A lamp house is located face to face with a substrate which is transferred by a conveyer means. A dielectric barrier discharge lamp is provided in the lamp house to irradiate the substrate with ultraviolet light, while a moistened inert gas, consisting of an inert gas and water vapor, is supplied to a space between the substrate and the dielectric barrier discharge lamp from a moistened inert gas generating means. Under irradiation of ultraviolet light from the dielectric barrier discharge lamp, water vapor in the moistened inert gas is split into a reducing active member [H·] and an oxidative active member [·OH].

27 Claims, 9 Drawing Sheets

APPARATUS AND METHOD FOR PROCESSING A SUBSTRATE

BACKGROUND OF THE INVENTION

1. Field of the Art

This invention relates to a method and an apparatus for treating surfaces of substrates such as of LCD panels, semiconductor wafers, magnetic storage disks and optical storage disks which are formed of glass, semiconductor, synthetic resin, ceramics, metals or a composite material of these materials, and more particularly to a method and an apparatus for treating substrate surfaces by irradiation of ultraviolet light in a washing or etching stage of a fabrication process.

2. Prior Art

For instance, a circuit pattern including transparent electrodes is formed on a TFT substrate which constitutes a transparent substrate of an LCD panel by the use of a film-forming means. In suc a substrate fabrication process, surfaces of substrates are processed by washing and etching treatments. In a processing of this sort, it has been the general practice to employ a wet process in which treating liquids are applied or injected on substrate surfaces. However, recently the so-call dry processes are introduced into this field, carrying out washing and etching treatments by irradiation of ultraviolet light.

For example, Japanese Laid-Open Patent Application H5-224167 discloses a method of washing glass substrates of LCD panel. In this case, substrates are irradiated with ultraviolet light prior to starting a wet process using a washing liquid. In this known washing method, substrate surfaces are irradiated with ultraviolet light from a low-pressure mercury lamp in a preparatory stage leading to a washing stage. By irradiation of ultraviolet light, organic substances on the substrate surfaces are chemically removed, and at the same time wettability of substrate surfaces is improved to have a smaller contact angle for removing inorganic contaminants efficiently when subsequently washed in a shower or the like. In this regard, ultraviolet light from a low-pressure mercury lamp has peaks approximately at 185 nm and 254 nm in wavelength distribution. Ultraviolet light with such wavelength distribution characteristics can remove organic substances which have deposited on substrate surfaces.

The mechanism of washing off organic substances by ultraviolet irradiation includes decomposition of organic substances into products of low molecular weights by severing chemical bonds, and activation of decomposed products. In addition, simultaneously ozone is produced as a result of absorption of ultraviolet light by oxygen in the air, and ozone is converted into active oxygen. Therefore, through oxidative destructive reactions with active oxygen, activated organic contaminants are finally converted into volatile substances such as $CO_x$, $H_2O$, $NO_x$ are released into the air, that is, removed from substrate surfaces.

As mentioned hereinbefore, ultraviolet light which is irradiated from a low-pressure mercury lamp has a wavelength of 185 nm on the shorter side. Therefore, of various organic compounds which have deposited on substrate surfaces, the ultraviolet light may not be able to decompose those compounds which have chemical bonds of strong energy like double bonds. This means that ultraviolet light of shorter wavelengths should be employed, in order to wash substrates more completely.

In an attempt to solve this problem, proposed in Japanese Laid-Open Patent Specification H7-196303 is a method of dry-washing work, irradiating substrate surfaces with vacuum ultraviolet light from a dielectric barrier discharge lamp.

In the case of this washing method according to Japanese Laid-Open Patent Specification H7-196303, in removing organic contaminants which have deposited on substrate surfaces, active oxidative decomposition products are produced by chemical reaction with ultraviolet light rays in vacuum. Namely, in this case, ultraviolet light rays of 172 nm which are irradiated from a dielectric barrier discharge lamp decompose organic substances into products of low molecular weight by destructing chemical bonds in the organic substances, while at the same time activating the decomposition products. At the same time, oxygen in the air is decomposed and activated by the action of the ultraviolet light. Therefore, the activated organic substances are converted into volatile substances such as $CO_x$, $H_2O$, $NO_x$ and so forth by oxidative reactions with active oxygen and ultimately released into the air. As a result, the treated substrate surfaces come to have a smaller contact angle in terms of wettability.

However, since ultraviolet light is consumed for cracking oxygen in the air, an air layer between the discharge lamp and a substrate is increased in thickness to cause an exponential attenuation to the amount of ultraviolet light rays which can reach a substrate surface. Consequently, there occur conspicuous degradations in the capacities of activating organic substances on substrate surfaces and producing active oxygen in the vicinity of substrate surfaces, that is, in the capacity of removing contaminant organic substances by ultraviolet light. Besides, it is only active oxidative decomposition products that are produced by irradiation of an oxygen-containing fluid with ultraviolet light in vacuum. Therefore, depending upon the kinds of organic substances which have deposited on substrate surfaces, it is often found difficult to remove deposited organic contaminants from substrate surfaces simply by oxidative reactions.

SUMMARY OF THE INVENTION

In view of the foregoing situations, it is an object of the present invention to enhance the accuracy and efficiency in washing or treating substrate surfaces with ultraviolet light rays. It is a more specific object of the present invention to enhance decomposing effects on organic contaminant substances on substrate surfaces while at the same time minimizing the contact angle of substrate surfaces by irradiating same with ultraviolet light in an atmosphere substantially free of oxygen.

It is another object of the present invention to provide a method and an apparatus for producing an oxidative active member and a reducing active member by irradiating substrate surfaces with ultraviolet light rays in a mixed atmosphere of an inert gas and, thereby ensuring reactions with decomposition products of organic substances to proceed efficiently in an assured manner.

In accordance with the present invention, for achieving the above-stated objectives, there is provided an apparatus for treating substrate surfaces, which comprises: a lamp house located over a substrate transfer path and face to face with a treating surface of a substrate being transferred along the transfer path by a conveyer means; a dielectric barrier discharge lamp fixedly mounted in the lamp house to irradiate ultravilot light toward the substrate; and a moistened inert gas generating means adapted to supply a water vapor-containing moistened inert gas to a space between the substrate and the dielectric barrier discharge lamp; producing a reducing active member [H.] and an oxidative active member [.OH] by irradiating said moistened inert gas with ultraviolet light from said dielectric barrier discharge lamp.

The lamp house may be arranged to have an ultraviolet light transmitting window on the side which faces a substrate under treatment. Alternatively, in a case where the lamp house is provided within a chamber, it may be opened to the chamber on the side which faces a substrate. In such a case, an inert gas feed means is connected to the lamp house to put the latter in an inert gas atmosphere. The chamber is put in a moistened inert gas atmosphere which is substantially free of oxygen, between entrance and exit openings which are provided at upstream and downstream ends for substrates to be treated. Alternatively, the lamp house may left open on the side of the chamber, or may be fitted with such a partition member on the open side as will transmit ultraviolet light and contain a large number of passages to let the inert gas flow out.

In another form of the present invention, the lamp house is located in and opened to the chamber, and an inert gas feed means is connected to the lamp house. Further, the moistened inert gas generating means may be arranged to include a moistened inert gas feed means which is connected to the chamber to supply a water vapor-containing moistened inert gas toward the surface of a substrate.

Alternatively, the moistened inert gas generating means may be constituted by a pure water vessel which is located within the chamber with an upper open end face to face with the lamp house across the substrate transfer path, and an inert gas feed means which is provided with blow holes to blow an inert gas into the pure water vessel.

On the other hand, according to the present invention, there is also provided a method for treating substrate surfaces, which comprises the steps of: placing a substrate in a mixed atmosphere of an inert gas and water vapor under irradiation of ultraviolet light from a dielectric barrier discharge lamp, thereby splitting water vapor into a reducing active member [H.] and an oxidative active member [.OH]; and letting the reducing and oxidative active members [H.] and [.OH] contact with a surface of said substrate to be treated.

According to a more specific form of the present invention, the method for treating substrate surfaces comprises the steps of: horizontally transferring a substrate into a mixed atmosphere of an inert gas and water vapor under irradiation of ultraviolet light from a dielectric barrier discharge lamp, thereby decomposing organic substances deposited on a surface of the substrate and at the same time splitting water vapor into a reducing active member [H.] and an oxidative active member [.OH]; dry-washing and minimizing contact angle of a surface of the substrate by subjecting the reducing and oxidative active members [H.] and [.OH] to reactions with decomposition products of the organic substances; wet-washing the substrate by supplying a wash liquid thereto; and drying the substrate.

The above and other objects, features and advantages of the present invention will become apparent from the following particular description of the invention, taken in conjunction with the accompanying drawings. Needless to say, the accompanying drawings show by way of example some preferred embodiments of the present invention for illustrative purposes only, and should not be construed as being limitative of the invention in any way whatsoever.

DESCRIPTION OF PREFERRED EMBODIMENTS

Figure 1:
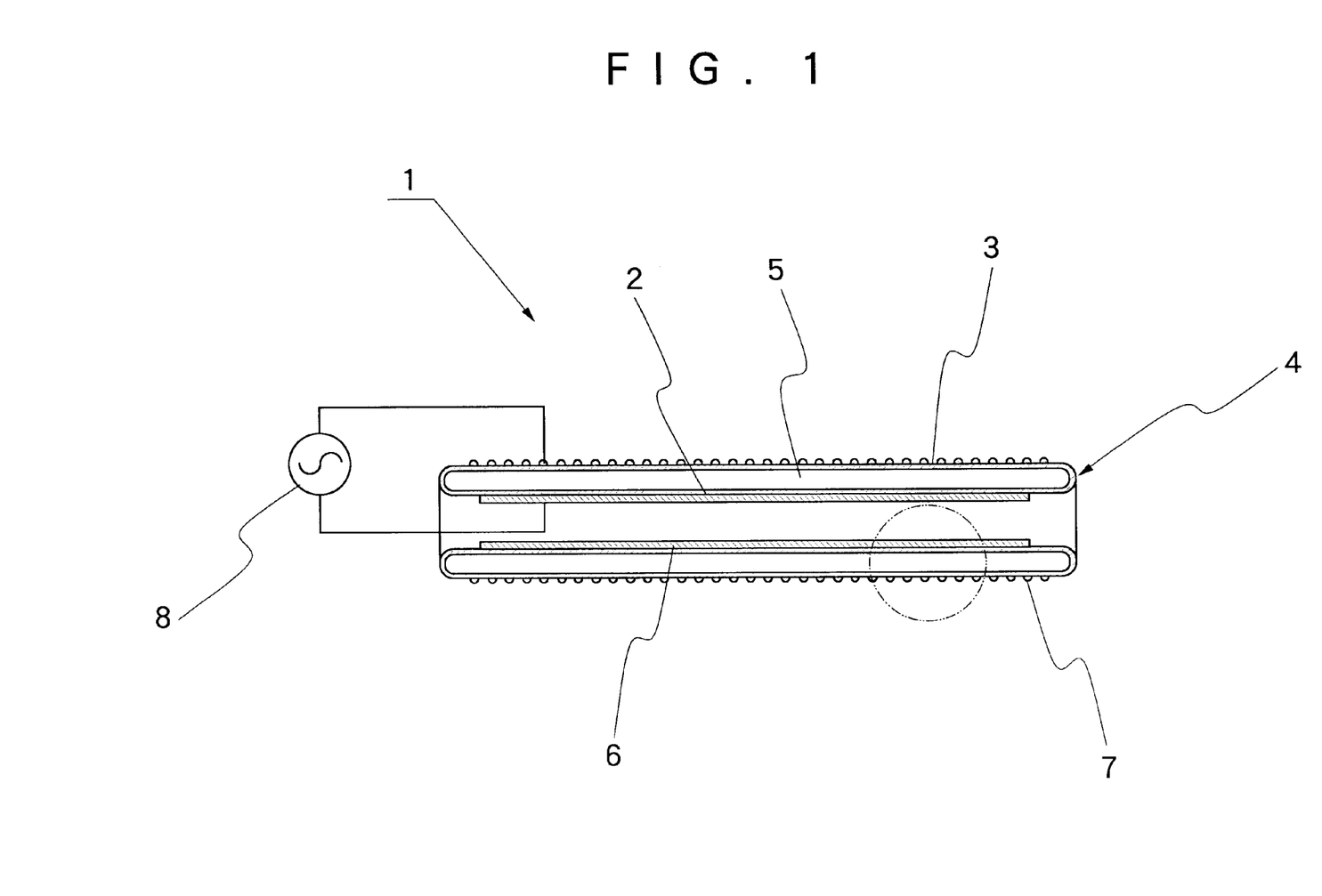
FIG. 1 is a schematic view of a dielectric barrier discharge lamp assembly used on a substrate processing apparatus according to the present invention.
Figure 2:
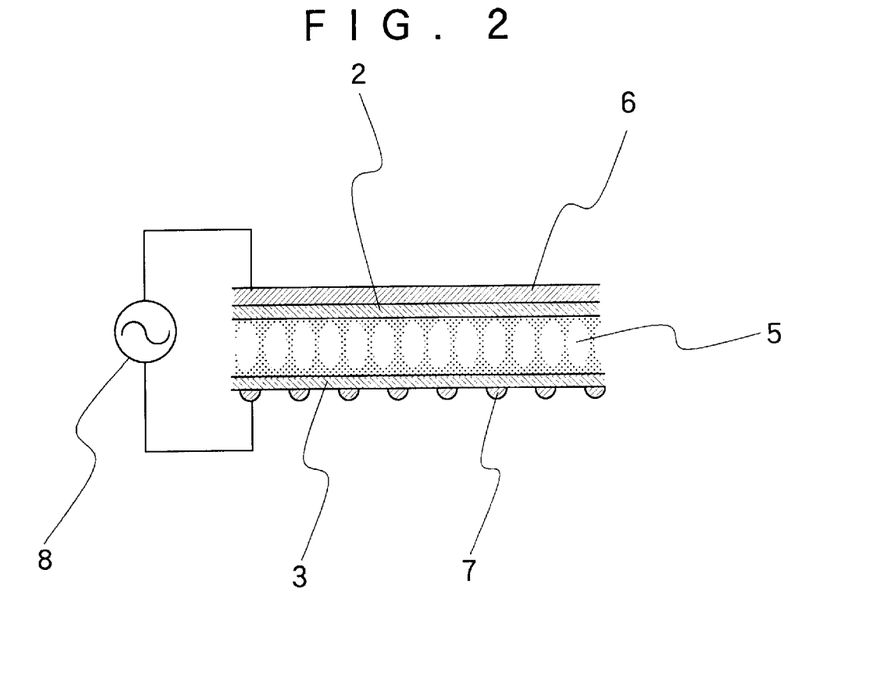
FIG. 2 is a fragmentary enlarged view of the dielectric barrier discharge lamp assembly shown in FIG. 1.

Hereafter, the present invention is described more particularly by way of its preferred embodiments shown in the drawings. Firstly, schematically shown in FIGS. 1 and 2 is a dielectric barrier discharge lamp assembly (hereinafter referred to simply as 'discharge lamp' for brevity) which is employed on substrate processing apparatus according to the present invention.

In these figures, indicated at 1 is the discharge lamp. The discharge lamp 1 is constituted by a quartz glass tube 4 of an annular shape, having inner and outer tubes 2 and 3 which are both formed of quartz glass and integrally with each other. Provided internally of the quartz glass tube 4 is a hermetically closed discharge space 5. Securely fixed to the inner side of the inner tube 2 is a metal electrode 6 consisting of a cylindrical metal sheet. On the other hand, provided on the outer periphery of the outer tube 3 is a metal mesh electrode 7. An ac power source 7 is connected between the metal electrode 6 and metal mesh electrode 6. Further, a passage for a cooling fluid (e.g., cooling water) is provided on the inner side of the inner tube 2 for cooling the metal electrode 6.

A discharge gas is sealed in the quartz glass tube 4, so that, upon applying an ac high voltage between the metal electrode 6 and the metal mesh electrode 7, discharge plasma (dielectric barrier discharge) occurs across a dielectric between the inner and outer tubes 2 and 3, and, by this discharge plasma, atoms of the discharge gas are excited into a plasma discharge state. Plasma discharge emission takes place as the discharge gas atoms in the plasma state return to a normal state. At this time, the emission spectrum varies depending upon the nature of the discharge gas which is sealed in the quartz glass tube 4. In the case of a xenon (Xe) gas, for example, monochrome light having a center wavelength at 172 nm is emitted. In a case where argon (Ar) gas is used as a discharge gas, the emission has a center wavelength of 126 nm which is shorter than that of a low-pressure mercury lamp. The metal electrode 6 functions as a reflector plate, while the metal mesh electrode 7 functions substantially as a transparent electrode. Therefore, ultraviolet light of short wavelength is irradiated from the side of the outer tube 3. In this instance, for example, the charged pressure of xenon gas is approximately 350 torr.

Figure 3:
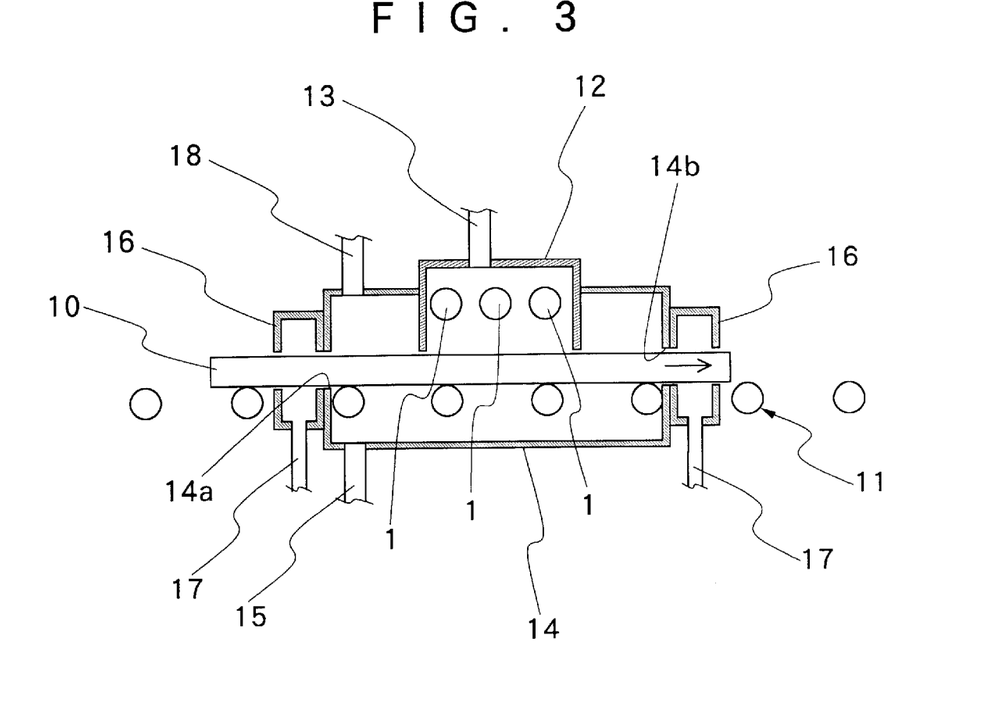
FIG. 3 is a schematic sectional view of a substrate processing apparatus, adopted as a first embodiment of the present invention.

Schematically illustrated in FIG. 3 is an apparatus for dry-washing transparent substrates of LCD panels by the use of the discharge lamp 1 as described above. In this figure, indicated at 10 is a substrate plate under a dry-washing treatment. For example, the substrate 10 consists of a thin plate of glass, semiconductor, synthetic resin, ceramics, metal and so forth, and of a rectangular or circular shape in plan view. The substrate 10 is supported on a transfer means, for example, on a roller conveyer 11 and thereby transferred in the direction indicated by an arrow in the same figure while receiving a dry-washing treatment on its surface or surfaces. For this purpose, a lamp house 12 of the washing apparatus is located in a predetermined position in the path of transfer by the roller conveyer 11. The lamp house 12 is so positioned as to face the surface or surfaces of the substrate 10 which need a treatment.

The lamp house 12 is in the form of an enclosure or a container which is open on the lower side, and is internally provided with one or a plural number of discharge lamps 1 (three discharge lamps in the case of the particular embodiment shown). In this instance, the lower end of the lamp house 12 is positioned to face the upper surface of the substrate 10 in non-contacting state with the latter, more particularly, is maintained in small gap relation with the upper surface of the substrate 10 by adjusting a substrate transfer level by the roller conveyer 12. Connected to the lamp house 12 is a nitrogen gas feed pipe 13 which supplies the lamp house 12 with nitrogen gas (N$_2$ gas) as an inert gas in a dry state. Namely, the lamp house 12 is supplied with a dry nitrogen gas under a predetermined pressure to maintain the inside of the lamp house in an atmosphere free of oxygen. This arrangements prevent ultraviolet light from the discharge lamp 1 from attenuating before reaching a proximity of the treating surface of the substrate 10.

Indicated at 14 is a chamber for a dry-washing treatment, and the lower end of the lamp house 12 is opened to the chamber 14, which contains the lower side of the roller conveyer 11. Connected to the chamber 14 is a moistened inert gas feed pipe 15 which supplies the chamber 14 with a moistened inert gas, which is a mixed fluid of water vapor and nitrogen gas. The moistened inert gas is supplied under pressure which is slightly lower than the pressure of nitrogen gas which is supplied to the lamp house 12. Therefore, although the lower end of the lamp house 12 is opened to the chamber 14, the moistened inert gas would not go into the lamp house 12.

Further, the chamber 14 is provided with an entrance opening 14a at one end for admission of a substrate 10 and with an exit opening 14b at the other end for a substrate leaving the chamber 14. In order to prevent the nitrogen gas and the moistened inert gas from escaping through the entrance and exit openings 14a and 14b, the chamber 14 is provided with pressure chambers 15 at its opposite ends, that is, on the outer side of the entrance and exit openings 14a and 14b, respectively. By compressed air which is supplied through pipes 17, the pressures in these pressure chambers 16 are maintained at a level which is slightly higher than the internal pressure of the chamber 14. Further, an exhaust pipe 18 is connected to the chamber 14, forcibly discharge exhaust gases therethrough to maintain the inside of the chamber 14 constantly at a predetermined pressure level.

Alternatively, instead of supplying compressed air, the pressure chambers 16 may be maintained at a negative pressure level by applying suction force to the pipes 17. In case the pressure chambers 16 are maintained at a negative pressure level, gases in the chamber 14 flow into the pressure chambers 16 through the entrance and exit openings 14a and 14b. Therefore, in this case, the pressure chambers 16 and pipes 17 function as an exhaust means, and it becomes unnecessary to connect the exhaust pipe 18 to the chamber 14.

Figure 4:
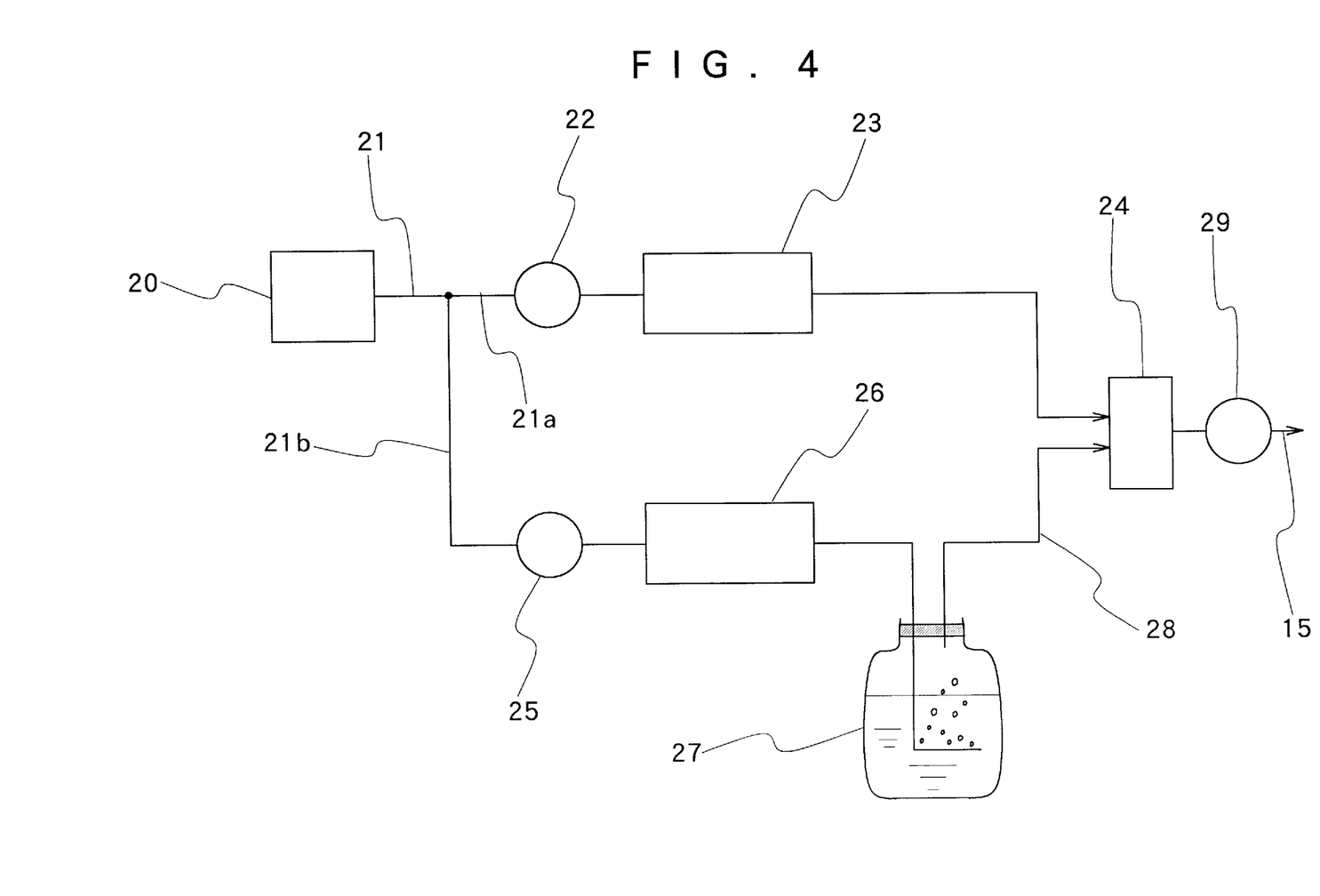
FIG. 4 is a diagrammatic view of an inert gas moisturizer.

The moistened inert gas feed pipe 15, which supplies a mixture of nitrogen gas and steam, is connected to an inert gas moisturizer, which is arranged, for example, as shown in FIG. 4. In this figure, indicated at 20 is a nitrogen gas tank as a source of nitrogen gas. A feed pipe 21 from the nitrogen gas tank 20 is divided into two branch pipes 21a and 21b, of which the branch pipe 21a is connecting to a mixing container 24 through a flow regulator valve 22 and a flow meter 23.

On the other hand, the branch pipe 21b is connected to and submerged in a pure water tank 27 through a flow regulator valve 25 and a flow meter 26. A submerged portion of the branch pipe 21b in the pure water tank 27 is provided with a multitude of fine pores for blowing out nitrogen gas. Therefore, nitrogen gas, which is supplied into the pure water tank 27 through the branch pipe 21b under a predetermined pressure, climbs up in the form of bubbles toward the water surface, generating water vapor on the way. As a result, nitrogen gas is moistened with water vapor, forming a moistened nitrogen gas which can serves as a moistened inert gas. The thus-formed moistened nitrogen gas is introduced into the mixing container 24 through a pipe 28, and mixed with nitrogen gas from the branch pipe 21a to adjust the water vapor concentration in the moistened inert gas. Through a pressure regulator valve 29, the moistened inert gas is supplied from the mixing container 24 to the moistened inert gas feed pipe 15 which is connected to the chamber 14 as described hereinbefore. Thus, the moistened nitrogen gas pressure in the chamber 14 can be adjusted by way of the pressure regulator valve 29.

With the arrangements arranged as described above, dry nitrogen gas is fed to the lamp house 12 of the processing apparatus having the discharge lamp 1 lit on, while moistened nitrogen gas filled in the chamber 14 to provide an atmosphere substantially free of oxygen. In this state, a substrate on the roller conveyer 11 (having a plural number of rollers mounted on rotational shafts at predetermined intervals in the substrate transfer direction) is fed into the chamber 14 through the entrance opening 14a and passed through the chamber 14 under the lamp house 12 at a predetermined speed. While passing through the chamber 14, the surface of the substrate 10 is irradiated with short wavelength ultraviolet light from the discharge lamp 1 for dry-washing and improving wettability of the substrate surface.

At this time, a mixed fluid of nitrogen gas and water exists on or in the vicinity of the substrate surface, and water is cracked under irradiation of ultraviolet light from the discharge lamp 1 into a reducing active member [H.] and an oxidative active member [.OH]. Accordingly, by irradiation of short wavelength ultraviolet light, organic contaminants which have deposited on the surface of the substrate 10 are decomposed into products of lower molecular weights. Further, the low molecular weight products resulting from the decomposition of organic contaminants are subjected to reducing and oxidative reactions with the cracked active members of water. More specifically, not only oxidative reactions with the oxidative active member [.OH] but also reducing reactions with reducing active member [H.] take place on or in the vicinity of the surface of the substrate 10 to convert decomposed organic substances into volatile substances quickly in a more assured manner, and the resulting volatile substances are released to the outside through the exhaust pipe 18. As a result of this dry washing treatment, organic contaminants are removed from the surface of the substrate 10. Besides, the substrate surface becomes to have a smaller contact angle as a result of irradiation of short wavelength ultraviolet light in the presence of water vapor.

In this manner, the substrate surface with a smaller contact angle shows improved wettability in a subsequent wet washing treatment in a shower, permitting to wash away organic contaminants readily and completely from its surfaces. Accordingly, the substrate 10 can be washed into an extremely clean state. The above-described dry-washing treatment may be carried out for the purpose of improving surface conditions of substrates in a stage preparatory to application of a liquid developer or the like.

Figure 5:
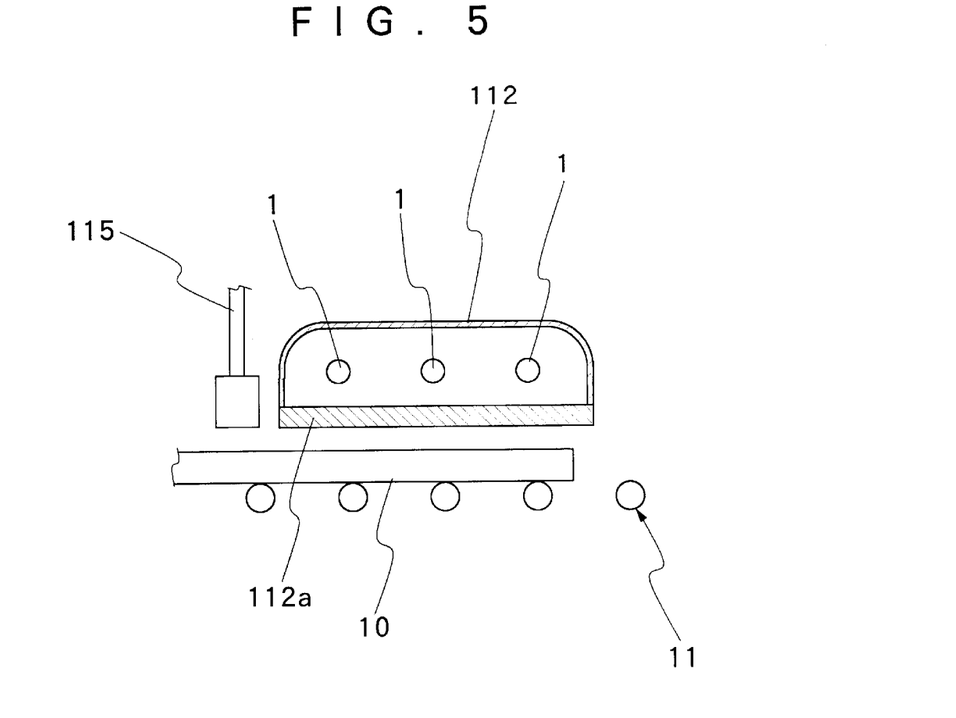
FIG. 5 is a schematic view of a substrate processing apparatus, adopted as a second embodiment of the present invention.

In the case of the first embodiment described above, the lamp house is connected to the lower chamber. However, for the sake of simplification in construction, it may be arranged, for example, as shown in FIG. 5. In the embodiment of FIG. 5, a lamp house 112 is arranged to completely cover or enshroud discharge lamps 1. In this case, on the side which faces a substrate 10, the lamp house 112 is provided is with a window 112a which is fitted with a pane of glass which is highly transmissive of ultraviolet light, 11 such as synthetic quartz glass or the like. With the lamp house 112 of this construction, the inert gas is sealed in the lamp house 112 and not allowed to escape to the outside. Accordingly, in this case, there is no necessity for constantly feeding an inert gas to the lamp house 112 as long as a predetermined amount of inert gas is sealed therein.

Figure 6:
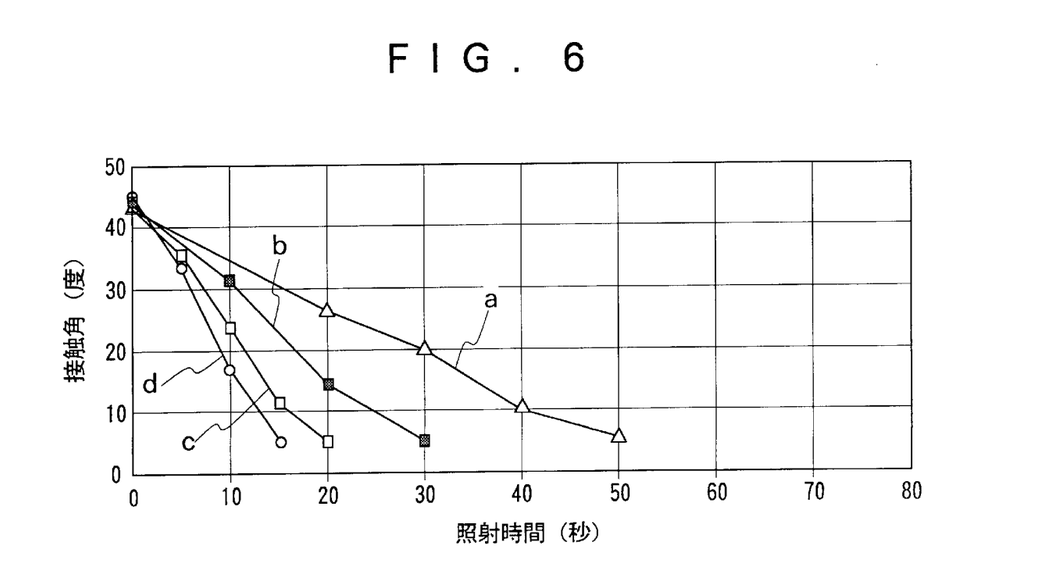
FIG. 6 is a graph, showing results of wettability improving tests using various supply gases to substrates, which were irradiated with ultraviolet light in a standstill state.

Shown in FIG. 6 are results of wettability improving experiments using the apparatus of FIG. 5 and changing the nature of a feed gas to the substrate 10.

In the experiments, dry air, moistened air containing water vapor, dry nitrogen gas and moistened nitrogen gas containing water vapor were used as a feed gas. The apparatus of FIG. 4 was used for moistened air and for moistened nitrogen gas, preparing a moistened gas by connecting to a pure water tank a pipe of 5 mm in inside diameter having 10 pores of 1 mm in diameter in its submerged fore end portions. Produced moistened gas was mixed with a dry gas in a ratio of 1:1. When a substrate 10 came to a position under the lamp house 12, the roller conveyer 11 was stopped for a treatment. The results of experiments are shown in FIG. 6.

In FIG. 6, plotted at a are results of experiments using dry air, at b are results of experiments using moistened air, at c are results of experiments using dry nitrogen gas, and at d are results of experiments using moistened nitrogen gas. As seen in this figure, as compared with effects in a dry state, the same gas can reduce the contact angle more quickly when it is moistened state. Comparing with air, nitrogen gas is more effecting in minimizing the contact angle quickly. When actually washing substrates 10, the transfer speed of the substrates 10 by the roller conveyer 11 is determined depending upon the size of the lamp house 12. For example, in a process using moistened nitrogen gas and a lamp house 12 measuring 450 mm in length in the substrate transfer direction, it suffices to transfer substrates at a speed of 30 mm/sec and to irradiate same with ultraviolet light for a time duration of approximately 15 seconds to attain an initial objective of the treatment.

The results of experiments show that the wettability can be improved more quickly and in an assured manner particularly when moistened nitrogen gas is feed to a substrate 10. In addition, organic contaminants on substrate surfaces can be decomposed smoothly and reliably into volatile forms not only through oxidative reactions but also through reducing reactions. Accordingly, it is most advantageous in a case where substrates 10 need to be processed on an industrial scale. While substrates 10 are sent into the chamber 14 successively at a predetermined speed, the water vapor in the moistened nitrogen gas is constantly maintained in a floating state within the entire inner space of the chamber 14. Therefore, the substrates as a whole can be washed clean and improved in wettability efficiently in an assured manner. Now, turning to FIG. 7, there is shown a third embodiment of the present invention. In this particularly embodiment, the processing apparatus includes a lamp house 212 with discharge lamps 1 and a processing chamber 214 for dry-washing or other surface treatment, similarly to the foregoing first embodiment. A substrate 10 which is transferred on a roller conveyer 11 is admitted into the changer 214 through an entrance opening 214a to receive a dry-washing treatment similarly under irradiation of ultraviolet light from the discharge lamps 1 before being further sent forward to a next treating stage through an exit opening 214b. A nitrogen gas feed pipe 213 is connected to the lamp house 212, while a moistened inert gas feed pipe 215 is connected to the chamber 214. Further, an exhaust pipe 218 is connected to the chamber 214 to forcibly discharge exhaust gases from the chamber 214. These arrangements are substantially same as in the foregoing first embodiment.

Figure 7:
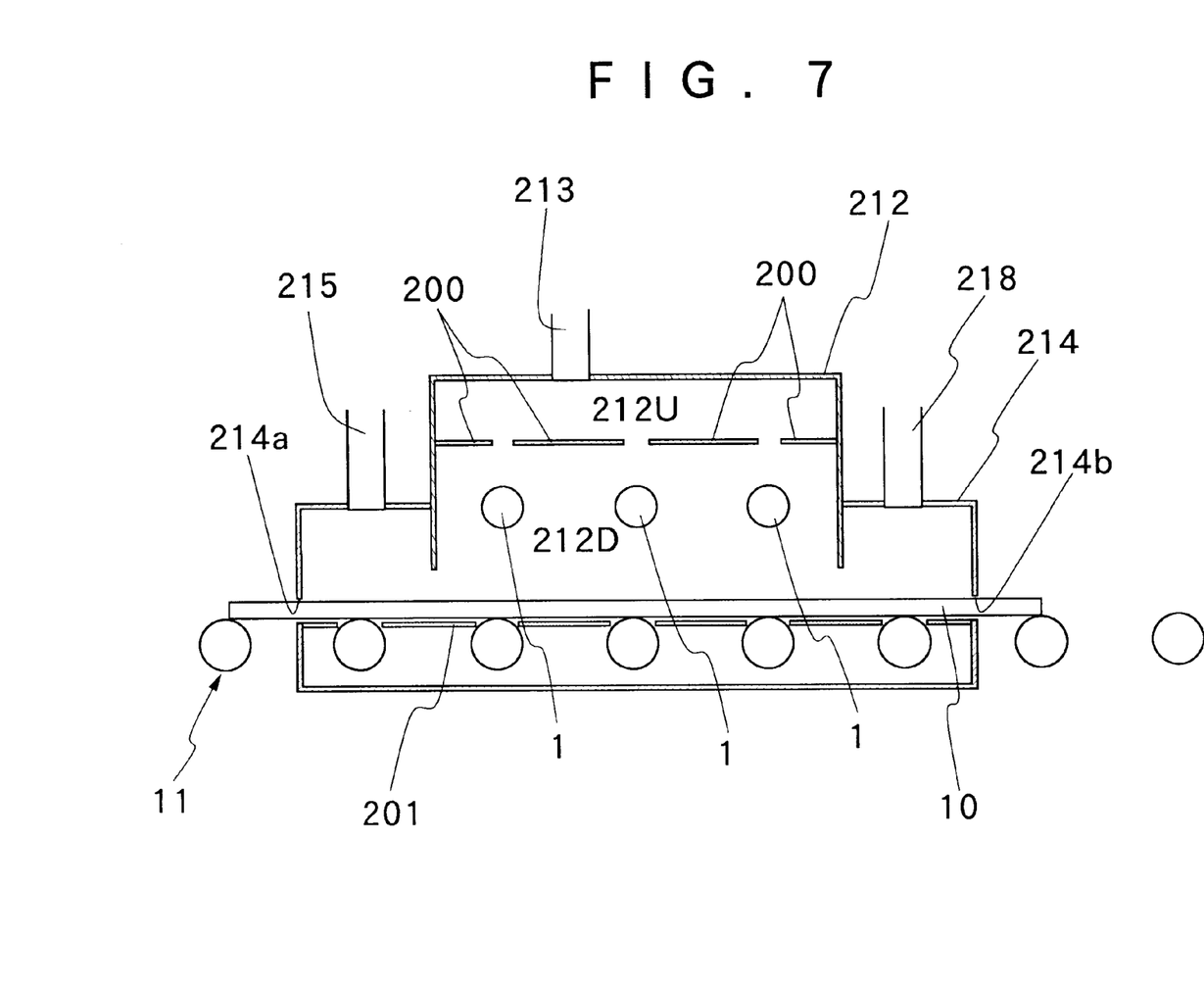
FIG. 7 is a schematic sectional view of a substrate processing apparatus, adopted as a third embodiment of the present invention.

In this case, however, a reflector plate 200 is provided within the lamp house 212. By the reflector plates 200, the lamp house 212 is divided into a lower room 212D with the discharge lamps 1 and an upper room 212U in communication with the nitrogen gas feed pipe 213. The reflector plate 200 itself is divided into a plural number of sections. Void portions in the reflector plate 200 provide dry nitrogen gas flow passages from the upper room 212U to the lower room 212D. In case the reflector plate 200 is constituted by a single undivided body, gas flow passages of this sort can be formed by punching slits or holes therein.

The lower side of the reflector plate 200 on the side of the lower room 212D is mirror-finished or coated with a reflecting film to provide a total reflection surface. Therefore, of the ultraviolet light which is emitted from the discharge lamps 1, upward components are substantially totally reflected off the reflector plate 200 in downward directions to irradiate the substrate 10. The void portions in the reflector plate 200, that is, the dry nitrogen gas flow passages are located substantially immediately above the discharge lamps 1. Namely, the reflector plate 200 does not exist immediately above the discharge lamps 1 because reflected ultraviolet light from these positions would be blocked by the discharge lamps 1 without reaching the substrate 10. It follows that almost all of the ultraviolet light, which is irradiated by the discharge lamps 1, contributes to the dry-washing of the substrate 10 without losses. In this regard, if desired, the efficiency of ultraviolet light irradiation can be improved all the more by coating a reflecting film on or mirror-finishing the entire inner wall surfaces of the lamp house 212.

Further, by the reflector plate 200, the lamp house 212 is partitioned into the upper room 212U and the lower room 212D. Accordingly, nitrogen gas which is supplied to the lamp house 212 through the nitrogen gas feed pipe 213 once dwells in the upper room 212 and then flows into the lower room 212D through the void portions which are provided in a plural number of distributed positions of the reflector plate 200. As a consequence, the nitrogen gas flows into every part of the lower room 212D uniformly in flow rate and pressure. Especially, since a reflector plate portion which contains no void gap is located beneath the inlet opening of the nitrogen gas feed pipe 213, nitrogen gas from a single feed pipe is distributed uniformly to the entire space of the lower room 212D of the lamp house 212.

Further, the chamber 214 is provided with a partition plate 201 in assocation with the roller conveyer 11. The partition plate 202 is provided with openings to receive top portions of the respective rollers of the roller conveyer 11 which abut against the lower side of the substrate 10. However, the partition plate 303 itself is kept out of contact with the lower side of the substrate 10. The partition plate 202 functions to suppress pressure fluctuations within the chamber 214 as well as disturbance in the moistened nitrogen gas flow which may otherwise occur as a substrate 10 is admitted into the chamber 214 or sent out of the chamber 214 through the exit opening 214b.

In this instance, the partition plate 202 can be arranged to function also as a plate heater. If so arranged, each substrate 10 which is transferred by the roller conveyer 11 can be heated in the chamber 214 for the purpose of enhancing the efficiency and capacity of the dry-washing treatment all the more.

Figure 8:
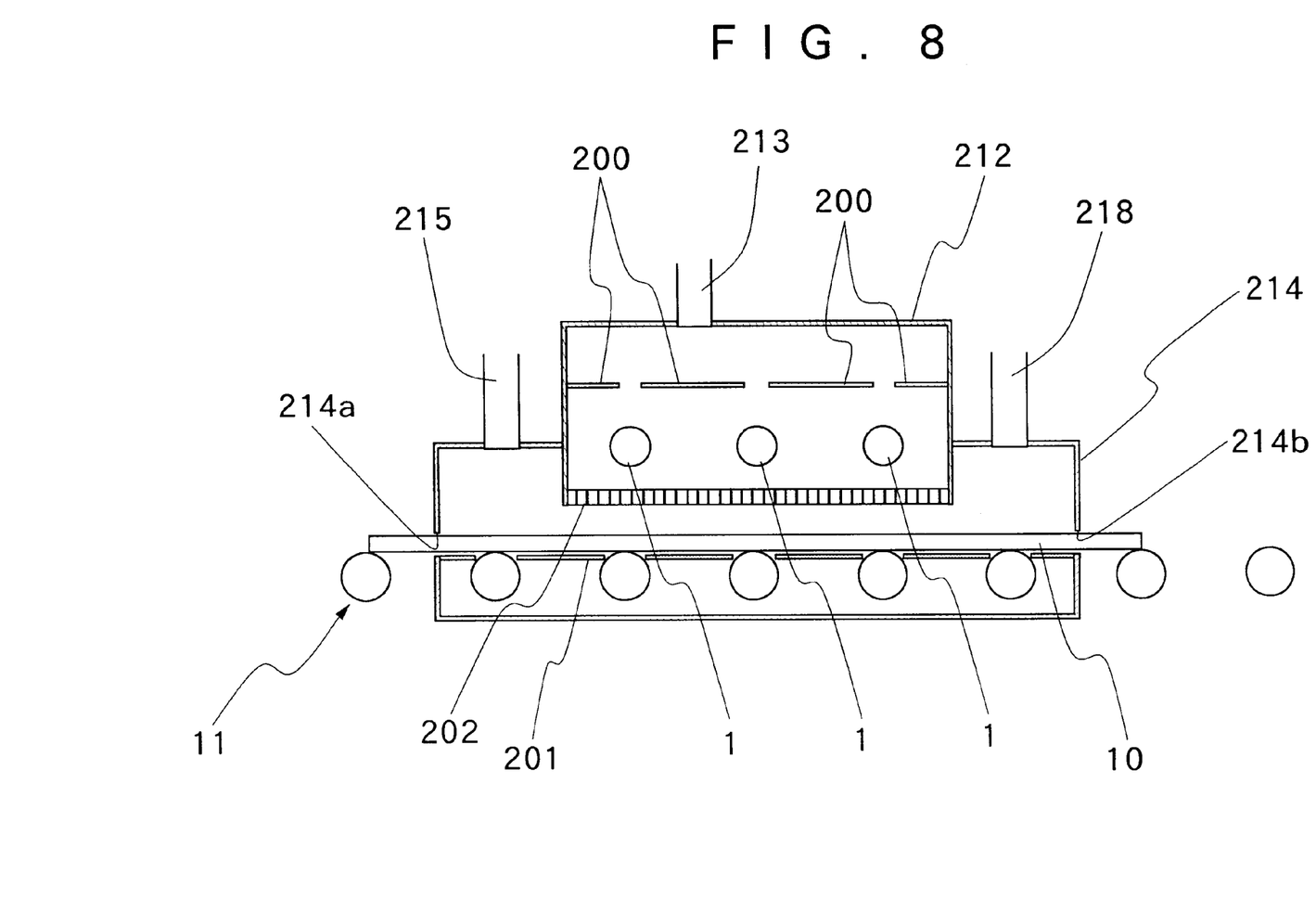
FIG. 8 is a schematic sectional view of a substrate processing apparatus, adopted as a fifth embodiment of the present invention.

Illustrated in FIG. 8 is a fourth embodiment of the present invention. In this embodiment, a boundary is provided across an opening at the lower end of the lamp house 212 which is projected into the chamber 214, drawing a border between a dry nitrogen gas atmosphere in the lamp house 212 and a moistened inert gas atmosphere in the chamber 214. The boundary is formed by the use of a partition plate 202 of a predetermined thickness. The partition plate 202 is constituted, for example, by a plate of honeycomb or grid-like structure which contains a multitude of fine passages across its thickness and in its entire surface areas. Further, the partition plate is coated with a reflecting film, including inner surfaces of fine passages.

In this case, the dry nitrogen gas in the lamp house 212 is maintained at a pressure level slightly higher than a gas pressure within the chamber 214. Therefore, a border is defined between the dry nitrogen gas atmosphere in the lamp house 212 and the moistened inert gas atmosphere in the chamber 214, and the moistened inert gas in the chamber 214 is prevented from flowing into the lamp house 212. Besides, the partition plate 202 is provided with a multitude of fine passage and coated with a reflecting film substantially on its entire surfaces as described hereinbefore, the ultraviolet light rays from the discharge lamps can pass through the fine passages even if the thickness of the partition plate 202 is increased to some extent. The ultraviolet light rays are reflected on inner surfaces of the fine passages and thereby led into the chamber 214.

Figure 9:
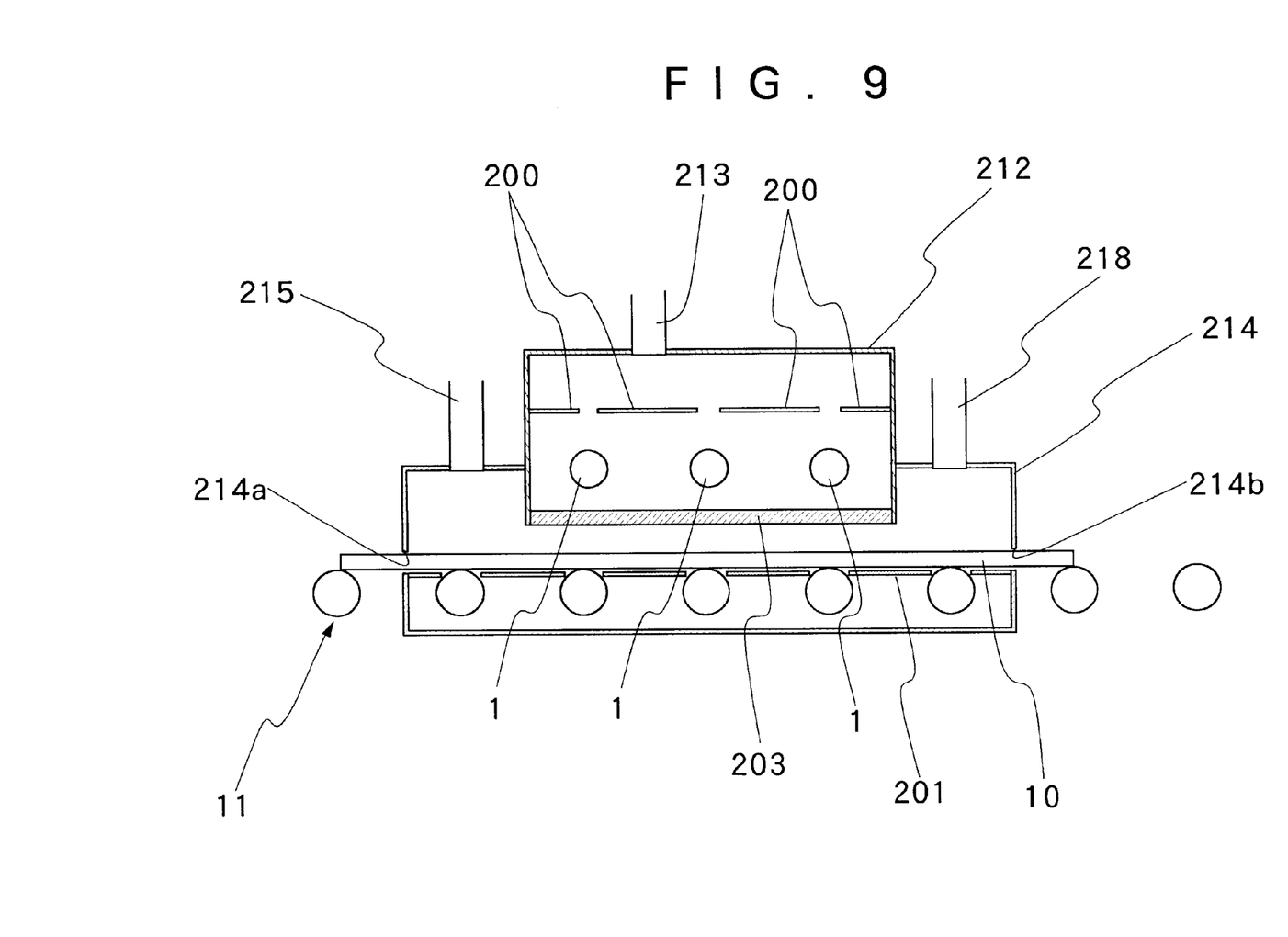
FIG. 9 is a schematic sectional view of a substrate processing apparatus, adopted as a sixth embodiment of the present invention.
Figure 10:
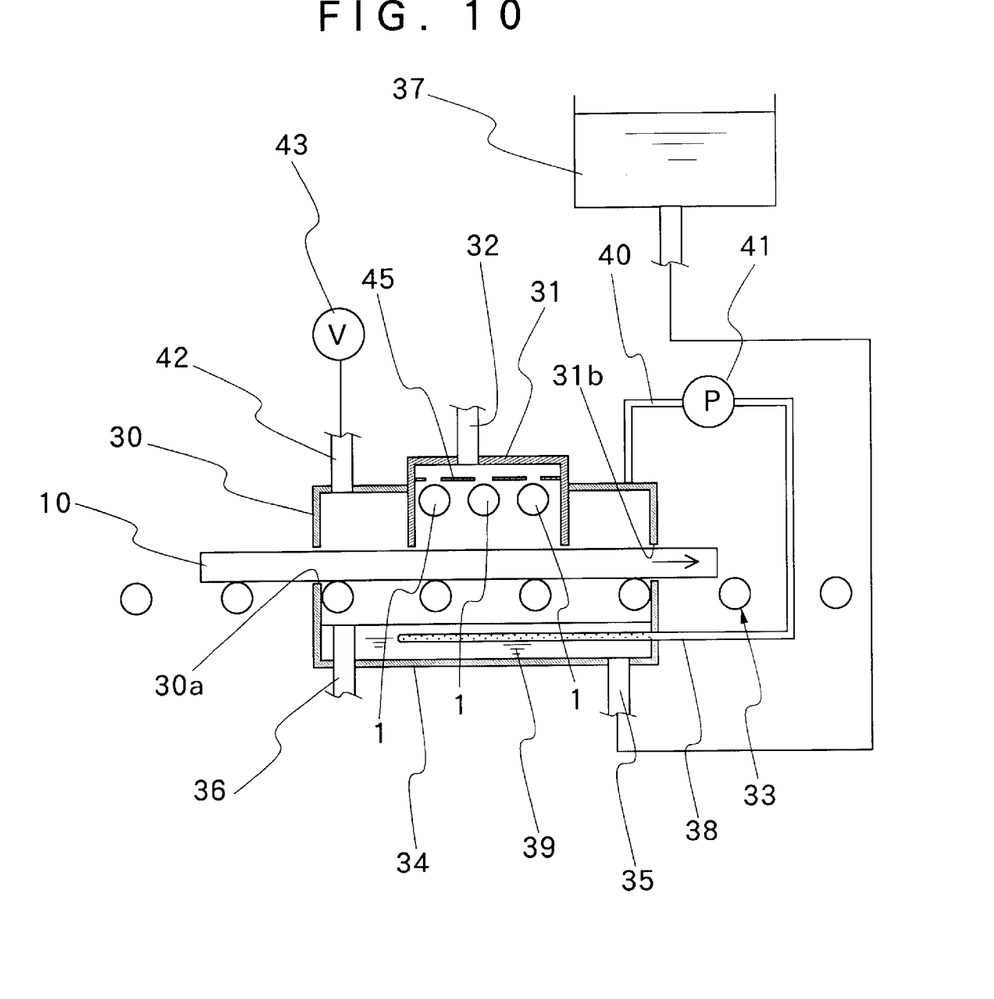
FIG. 10 is a schematic sectional view of a substrate processing apparatus, adopted as a seventh embodiment of the present invention.

Furthermore, in place of the above-described partition plate, a window pane 202 of an ultraviolet light transmitting material such as quartz glass or the like may be fitted in the lower opening of the lamp house as in a fifth embodiment of the invention shown in FIG. 9. In this case, although dry nitrogen gas is supplied to the lamp house 212 through a nitrogen gas feed pipe 213, there is no necessity for keeping the supply of dry nitrogen gas because the lamp house 212 is substantially in a closed state. Any way, in the foregoing second to fifth embodiments, pressure chambers-may be provided on the outer side of the entrance and exit openings 214a and 214b of the chamber 214 in the same manner as in the first embodiment. The exhaust pipe 218 is not required in case such pressure chambers are maintained at a negative pressure level. Shown in FIG. 10 is a sixth embodiment of the present invention. In this embodiment, the processing apparatus is arranged to generate moistened inert gas within a n upper chamber 30. In a manner similar to the foregoing first embodiment, a lamp house 31 with one or a plural number of discharge lamps 1 is provided over the chamber 30, and the lower end of the lamp house 31 opened to the latter. Further, a nitrogen gas feed pipe 32 is connected to an upper portion of the lamp house 31, supplying dry nitrogen gas under a predetermined pressure to maintain an oxygen-free atmosphere therein.

The chamber 30 is arranged to circumvent the opening of the lamp house 31 and to extend to the lower side of a roller conveyer 33 which transfers a substrate 10. Entrance and exit openings 31a and 31b for the substrate 10 are opened in upstream and downstream ends of the chamber 30, respectively. The chamber 30 is filled with pure water up to a predetermined level to provide a water vessel 34 under the roller conveyer 33. In addition to simply holding water, the water vessel 34 is required to constantly supply fresh pure water, and, for this purpose, a water feed pipe 35 and a water discharge pipe 36 are connected to the water vessel 34. The other end of the water feed pipe 35 is connected to a water supply tank 37 which is located at a higher position than the water vessel 34. Accordingly, pure water is supplied to the water vessel 34 under pressure of water head. The water discharge pipe 36 is opened into the tank 34 at a position of a predetermined level, so that water in the vessel 34 is allowed to overflow into the water discharge pipe 36 as soon as the water level rises up to the position of the water discharge pipe 36. Accordingly, the water surface level in the vessel 34 is maintained constantly at a predetermined height.

In the drawing, indicated at 38 is a nitrogen gas feed pipe which serves as an inert gas feed pipe. A fore end portion of this nitrogen gas feed pipe 38 is immersed in pure water in the water vessel 34 over a predetermined length. The nitrogen gas feed pipe 38 is provided with a large number of fine blow holes in its immersed fore end portion. As nitrogen gas is supplied to the nitrogen gas feed pipe 38 under a predetermined pressure, bubbles of nitrogen gas are incessantly generated around the immersed fore end portion of the nitrogen gas feed pipe 38, and water vapor is generated to moisten the nitrogen gas as the bubbles climb up toward the water surface within the vessel 34. As a result, the inner space over the water surface level of the pure water vessel 34 is put in an atmosphere of moistened nitrogen gas which contains water vapor.

Nitrogen gas may be supplied to the nitrogen gas feed pipe 38 from a bomb or steel bottle. However, in the case of the embodiment shown in FIG. 10, nitrogen gas is supplied from inside of the chamber 30. For this purpose, a circulating pipe 40 is connected to a wall portion of the chamber 30. The other end of the circulating pipe 40 is connected to a pump 41 the delivering side of which is connected to the nitrogen gas feed pipe 38. Accordingly, upon actuating the pump 41, nitrogen gas in the chamber 30 is taken up into the circulating pipe 40 and supplied to the nitrogen gas feed pipe 38. Further, connected to the chamber 30 is an exhaust pipe 42 which is provided with a pressure control valve 43 within its length. Therefore, as soon as the internal pressure of the chamber 30 exceeds a preset value, excessive nitrogen gas in the chamber 30 is discharged through the exhaust pipe 42 to maintain the chamber 30 constantly at a predetermined pressure level.

With these arrangements, the inside of the lamp house 31 is put in a dry nitrogen gas atmosphere, while the inside of the chamber 30, except the lamp house 31, is put in a moistened nitrogen gas atmosphere which consists of nitrogen gas and water vapor and which is substantially free of oxygen. By nitrogen gas which is supplied through the nitrogen gas feed pipe 38, the inside of the lamp house 31 is maintained at a pressure level which is higher than the atomopheric pressure. However, by way of an exhaust pipe 42 which is connected to the chamber 30, the internal pressure of the chamber 30 is maintained at a level intermediate between the internal pressure of the lamp house 31 and the atmospheric pressure. As a consequence, due to constant gas flows from the lamp house 31 into the chamber 30, the inside of the lamp house 31 is maintained in a dry state, precluding possibilities of water vapor entering the lamp house 31. On the other hand, the chamber 30 is maintained at a higher pressure level than the atmospheric pressure, there is no possibility of air entering the chamber 30 from outside through entrance and exit openings 31a and 31b.

With the arrangements just described, the chamber 30 can be filled with moistened nitrogen gas which contains both nitrogen gas and water vapor. Accordingly, as the discharge lamps 1 are lit on and a substrate 10 on the roller conveyer 33 is advanced into the chamber 30, the surface of the substrate 10 is dry-washed by irradiation of short wavelength ultraviolet light from the discharge lamps 1, which strips and removes organic contaminants from the substrate surfaces, and at the same time treated to have a smaller contact angle.

In this instance, when the substrate 10 comes face to face with the lamp house 31, the moistened nitrogen gas forms a thin layer on the front surface of the substrate. The thickness of the nitrogen gas layer can be adjusted by way of a pressure differential between the lamp house 31 and the chamber 30. In this regard, the pressure differential can be maintained constantly at a predetermined value by adjusting the control level of the pressure control valve 43 in the nitrogen gas feed pipe 42 which is connected to the chamber 30, while supplying nitrogen gas to the lamp house 31 through the nitrogen gas feed pipe 32 under a constant pressure.

If the thickness of a layer of the moistened nitrogen gas, i.e., a layer of a mixture of nitrogen gas and water vapor, between the discharge lamps 1 and the substrate 10 is increased to an excessive degree, the absorption of ultraviolet light by the moistened gas layer is increased correspondingly to lessen the effects on the substrate surface. On the contrary, in case the moistened nitrogen gas layer is too thin, the amount of decomposition products becomes smaller. Accordingly, the efficiency of dry-washing of substrate surfaces can be enhanced by setting an appropriate control value for the pressure control valve 43. Similar effects can be attained by controlling the flow rate of nitrogen gas through the nitrogen gas feed pipe 32 along with the flow rate of water vapor-containing nitrogen gas through the exhaust pipe 42.

Figure 11:
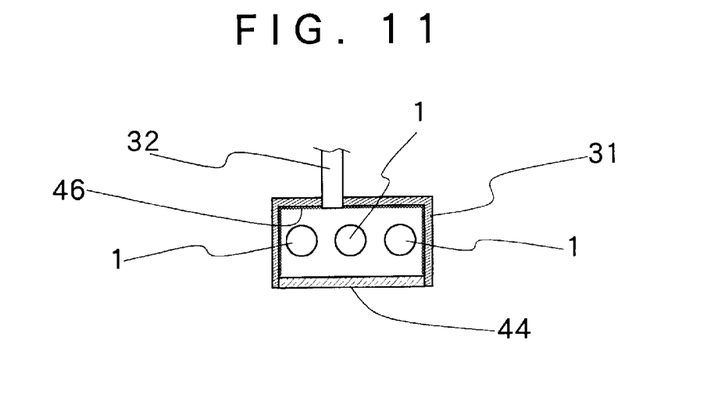
FIG. 11 is a schematic sectional view of a substrate processing apparatus, adopted as a eighth embodiment of the present invention.

In this instance, as shown in FIG. 11, a pane of quartz glass or other ultraviolet light transmitting glass may be fitted in the lower open side of the lamp house 31 thereby to hold an inert gas in the lamp house 31 a sealed state and to prevent its leaks to the outside.

Further, also in the case of the sixth embodiment shown in FIG. 10 and the seventh embodiment shown in FIG. 11, it is desirable for the lamp house 31 to include a function of reflecting back upward components of ultraviolet light toward the substrate. More particularly, a reflector plate 45 is located above the discharge lamps 1 in the case of the embodiment of FIG. 10, while a reflecting film 46 is coated on entire inner surfaces of the lamp house 31 in the case of the embodiment of FIG. 11.

As described hereinbefore, no matter whether moistened inert gas is supplied to the lamp house or it is generated within the lamp house, organic contaminants are removed from an irradiated surface of a substrate 10 and at the same time the contact angle of the substrate surface is minimized by a dry-washing treatment in the apparatus shown in the first to seventh embodiments of the invention. After a dry-washing treatment, the substrate 10 is further processed as schematically shown in FIG. 12.

Figure 12:
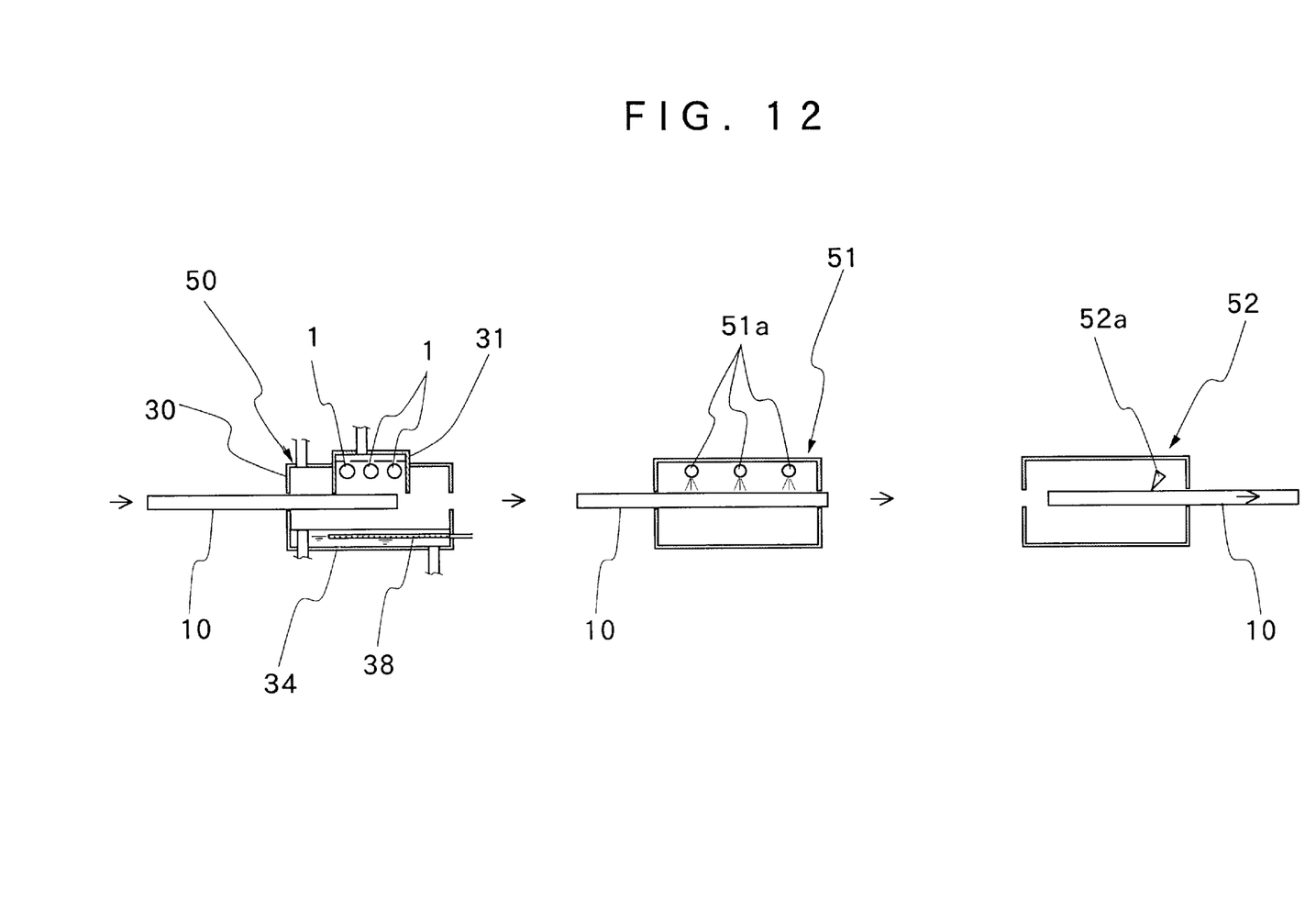
FIG. 12 is a schematic illustration of a substrate washing and drying line including a drying washing stage.

In FIG. 12, indicated at 50 is the above-described dry-washing stage, which in this particular case is followed by a wet-washing stage 51 and a drying stage 52 to clean up the surface of each substrate 10 completely.

In the wet-washing stage 51, inorganic contaminants on the surface of a substrate 10 are removed by a shower of ultrasonically vibrated pure water which is spurted out from a shower unit 51a. In this regard, the wet-drying stage 51 may be arranged to include a wet-washing treatment other than wet-washing in a pure water shower, for example, a treatment such as scrubbing by the use of brushes or dipping in an ultrasound water bath singly or in combination. By the end of the wet-washing operation, organic as well as inorganic contaminants are almost completely removed from the surface of the substrate 10 to bring the latter to an extremely clean state. Further, as for a drying system suitable for use in the drying stage 52, there may be employed, for example, a spin-drier or an air knife drier which is provided with an air knife nozzle 52a as shown in the drawing for drying substrates by air knife effects. Thus, substrates 10 are washed and dried completely through the processing line as described above.

Alternatively, the dry-washing may be carried out in a stage subsequent to the wet-washing and drying stages. For instance, in a case where the dry-washing is carried out as a pretreatment prior to application of a liquid developer, firstly contaminant substances are removed from surface of a substrate 10 by wet-washing and then once dried before sending the substrate to dry-washing to improve its surface conditions, particularly, to improve its contact angle. The dry-washing treatment makes it possible to apply a liquid developer or the like uniformly on the substrate surface in a subsequent stage.

What is claimed is:

1. An apparatus for treating substrate surfaces, comprising:

a conveyor means for conveying the substrate along a transfer path;

a lamp house located over the conveyor means and configured to face the surface of the substrate transferred along said transfer path by the conveyor means;

a dielectric barrier discharge lamp fixedly mounted in said lamp house and configured to irradiate ultraviolet light toward said substrate; and a moistened inert gas generating means for supplying a water vapor-containing moistened inert gas to a space between said substrate and said dielectric barrier discharge lamp;

wherein the dielectric barrier discharge lamp is configured to irradiate the moistened inert gas with ultraviolet light to produce a reducing active member (H.) and an oxidative active member (.OH) to contact the surface of the substrate.

2. An apparatus for treating substrate surfaces as defined in claim 1, wherein said substrate is a plate of glass, synthetic resin, ceramics or metal, or a composite plate of such materials.

3. An apparatus for treating substrate surfaces as defined in claim 1, wherein said moistened inert gas is a mixed fluid of water vapor and nitrogen gas.

4. An apparatus for treating substrate surfaces as defined in claim 1, wherein said lamp house is provided within a chamber holding a moistened inert gas atmosphere therein, the chamber provided with entrance and exit openings at upstream and downstream ends thereof for said substrate.

5. An apparatus for treating substrate surfaces as defined in claim 4, wherein said chamber is adapted to hold a substantially oxygen-free atmosphere therein.

6. An apparatus for treating substrate surfaces as defined in claim 4, wherein said conveyer means is constituted by a roller conveyer extending into and across said chamber.

7. An apparatus for treating substrate surfaces as defined in claim 6, wherein said chamber includes a partition plate located beneath a substrate transfer surface of said roller conveyer and out of contact with said substrate, said partition plate being provided with slots to receive top portions of rollers of said roller conveyer to be brought into abutting engagement with said substrate.

8. An apparatus for treating substrate surfaces as defined in claim 7, wherein said partition plate is configured to heat the substrate.

9. An apparatus for treating substrate surfaces as defined in claim 4, wherein said lamp house is opened into said chamber, and an inert gas feed means is connected to said lamp house.

10. An apparatus for treating substrate surfaces as defined in claim 9, wherein said inert gas feed means is constituted by an inert gas feed pipe connected to a top side of said lamp house, and a reflector plate is provided over said dielectric barrier discharge lamp in said lamp house to reflect upward components of said ultraviolet light, said reflector plate being so located as to divide said lamp house into an upper room in communication with said inert gas feed pipe and a lower room accommodating said dielectric barrier discharge lamp, said reflector plate containing void portions to circulate said inert gas from said upper room to said lower room.

11. An apparatus for treating substrate surfaces as defined in claim 9, wherein said moistened inert gas generating means includes a moistened inert gas feed means connected to said chamber and adapted to supply a water vapor-containing moistened inert gas toward said treating surface of said substrate.

12. An apparatus for treating substrate surfaces as defined in claim 10, wherein said inert gas feed means is adapted to supply said inert gas to said lamp house under a higher pressure than said moistened inert gas supplied by said moistened inert gas feed means.

13. An apparatus for treating substrate surfaces as defined in claim 10, wherein said moistened inert gas feed means is constituted by a water tank, and a nitrogen gas feed pipe having a multitude of gas blow holes in a fore end portion which is submerged in said water tank to generate a moistened inert gas.

14. An apparatus for treating substrate surfaces as defined in claim 13, further comprising a moistened inert gas induction pipe connecting said water tank to a mixing container to adjust concentration of water vapor in said moistened inert gas from said water tank, said mixing container being connected to said chamber through said moistened inert gas feed pipe.

15. An apparatus for treating substrate surfaces as defined in claim 14, further comprising an exhaust pipe connected to said chamber.

16. An apparatus for treating substrate surfaces as defined in claim 4, wherein said moistened inert gas generating means is constituted by a water vessel, which water vessel being open at a top end that faces said lamp house and adapted to hold water therein, and an inert gas feed means located in said water vessel and provided with a multitude of inert gas blow holes.

17. An apparatus for treating substrate surfaces as defined in claim 16, wherein a roller conveyer of said substrate conveyer means is located across said chamber, and said water vessel is located on the lower side of said roller conveyer.

18. An apparatus for treating substrate surfaces as defined in claim 14, wherein said lamp house is opened toward a front surface of said substrate being transferred along said path of transfer, and said inert gas feed means is connected to said lamp house.

19. An apparatus for treating substrate surfaces as defined in claim 16, wherein said inert gas feed means includes an inert gas feed pipe adapted to be immersed in water in said water vessel and provided with a multitude of gas blow holes.

20. An apparatus for treating substrate surfaces as defined in claim 16, further comprising a water feed pipe connected to said water vessel at one end thereof, and an overflow type water discharge pipe opened at a predetermined height of said water vessel.

21. An apparatus for treating substrate surfaces as defined in claim 20, wherein the other end of said water feed pipe is connected to a water tank located in a higher position than said water vessel.

22. An apparatus for treating substrate surfaces as defined in claim 16, further comprising an exhaust pipe connected at one end to said chamber and at the other end to a suction side of a pump, the delivery side of which pump being connected to said inert gas feed means.

23. An apparatus for treating substrate surfaces as defined in claim 4, wherein said lamp house is hermetically closed by an ultraviolet light transmitting window provided on a side facing toward said substrate.

24. An apparatus for treating substrate surfaces as defined in claim 23, wherein said window is paned with quartz glass.

25. An apparatus for treating substrate surfaces as defined in claim 9, wherein said lamp house is provided with a partition member of a predetermined thickness on a side facing toward said substrate, said partition member being provided with a multitude of fine holes across said thickness, and a reflecting film coated on entire surfaces of said partition member including inner surfaces of said fine holes.

26. An apparatus for treating substrate surfaces as defined in claim 1, wherein inner surfaces of said lamp house is coated with a reflecting film to reflect off ultraviolet light.

27. An apparatus for treating a surface of a substrate, comprising:
   a housing configured to face the surface of the substrate;
   a discharge lamp mounted in the housing; and
   a moistened inert gas generating means for supplying a moistened inert gas to a space between the substrate and the discharge lamp;
   wherein the discharge lamp is configured to irradiate the moistened inert gas with ultraviolet light to produce a reducing active member (H.) and an oxidative active member (.OH) to contact the surface of the substrate.

* * * * *